(12) United States Patent
Watanabe et al.

(10) Patent No.: US 7,855,761 B2
(45) Date of Patent: Dec. 21, 2010

(54) LIQUID CRYSTAL DISPLAY DEVICE

(75) Inventors: Saburo Watanabe, Ichinomiya (JP);
Hiroshi Tokuyama, Mobara (JP)

(73) Assignees: Hitachi Displays, Ltd., Chiba-ken (JP);
Hitachi Display Devices, Ltd.,
Chiba-ken (JP)

( * ) Notice: Subject to any disclaimer, the term of this patent is extended or adjusted under 35 U.S.C. 154(b) by 133 days.

(21) Appl. No.: 12/230,912

(22) Filed: Sep. 8, 2008

(65) Prior Publication Data

US 2009/0185099 A1   Jul. 23, 2009

(30) Foreign Application Priority Data

Sep. 18, 2007   (JP)   ............... 2007-240398

(51) Int. Cl.
*G02F 1/333*   (2006.01)
*G02F 1/1335*   (2006.01)

(52) U.S. Cl. .......................... 349/58; 349/62

(58) Field of Classification Search .................. 349/58, 349/56, 60, 61, 116, 139, 140, 62
See application file for complete search history.

(56) References Cited

U.S. PATENT DOCUMENTS

| | | | |
|---|---|---|---|
| 7,139,048 B2 * | 11/2006 | Han et al. .................. 349/62 |
| 7,197,338 B2 * | 3/2007 | Ozawa .................... 455/566 |
| 7,384,179 B2 | 6/2008 | Sakai | |
| 2003/0234897 A1 * | 12/2003 | Ozawa .................... 349/65 |
| 2007/0132909 A1 * | 6/2007 | Oohira ................... 349/58 |
| 2007/0165424 A1 * | 7/2007 | Sakai .................... 362/633 |
| 2009/0185099 A1 * | 7/2009 | Watanabe et al. ........ 349/58 |
| 2010/0020261 A1 * | 1/2010 | Oohira ................... 349/58 |

FOREIGN PATENT DOCUMENTS

| | | |
|---|---|---|
| CN | 101004510 A | 7/2007 |
| JP | 2003-281924 | 10/2003 |
| JP | 2006-235399 | 9/2006 |

* cited by examiner

*Primary Examiner*—Brian M Healy
(74) *Attorney, Agent, or Firm*—Stites & Harbison, PLLC; Juan Carlos A. Marquez, Esq.

(57) ABSTRACT

In a liquid crystal display device which uses light emitting diodes as a light source, a backlight can efficiently house a heat radiation plate even when an area of the heat radiation plate is increased by taking the radiation of heat from the light emitting diodes into consideration. Light emitting diodes are arranged on a metal substrate to form a plate-shaped light source portion. A heat radiation effect is enhanced by adhering a heat radiation plate to the plate-shaped light source portion. The heat radiation plate to which the plate-shaped light source is adhered is constituted as a housing casing thus efficiently housing the heat radiation plate. A problem which occurs due to the use of the metal-made housing casing can be overcome by mounting a resin-made light guide plate fixing member on the housing casing.

8 Claims, 11 Drawing Sheets

LIQUID CRYSTAL DISPLAY DEVICE

BACKGROUND OF THE INVENTION

1. Field of the Invention

The present invention relates to a light source of a non-self-luminous display device, and more particularly to a liquid crystal display device having a backlight which includes LEDs (light emitting diodes) as a light source.

2. Background Art

Recently, the liquid crystal display device has been popularly used as a display device. Particularly, the liquid crystal display device is used as a display part of portable equipment because the liquid crystal display device is thin and light-weighted and consumes small electric power.

However, the liquid crystal display device is not self-luminous and hence, the liquid crystal display device requires a lighting means. In general, as a lighting device of the liquid crystal display device, a planar lighting device referred to as a backlight is popularly used. Conventionally, although a cold cathode fluorescent lamp has been used as a light emitting element (also referred to as a light source) of the backlight, a light emitting element which uses LEDs has been also recently used for a portable equipment.

In a liquid crystal display device which uses LEDs as a light source, there has been proposed the constitution which takes the heat radiation into consideration. For example, JP-A-2003-281924 or the like discloses the structure in which LEDs and a box-shaped metal casing are adhered to each other. Further, JP-A-2006-235399 also discloses the structure in which a heat-conductive sheet is packed in a space around LEDs.

SUMMARY OF THE INVENTION

In an attempt to realize the high brightness using a large number of LEDs, an operating temperature of a liquid crystal display device has been elevated thus giving rise to a drawback that light emitting efficiency is lowered. To cope with this drawback, there has been proposed a liquid crystal display device having the constitution which radiates heat using a metal plate or the like as a heat radiation plate.

To perform the heat radiation more efficiently, the metal plate having a large area is used. However, even when the metal plate having a large area is used, housing of the heat radiation plate having a width thereof larger than a printed circuit board is not taken into consideration. Accordingly, even when the metal plate having a large area is merely provided as a heat-radiation plate, the metal plate is not suitable. for realizing a miniaturized backlight.

The present invention has been made under such circumstances and it is an object of the present invention to realize, in a liquid crystal display device having a backlight which includes a large number of light emitting elements, the backlight which can house a heat-radiation plate efficiently even when an area of the heat radiation plate is increased.

Further, in using the metal plate as a heat-radiation plate, the metal plate can be housed at a proper position without damaging a light guide plate.

A liquid crystal display device includes a liquid crystal panel, a backlight which radiates light to the liquid crystal panel, a plurality of light emitting elements mounted on the backlight, a printed circuit board on which the light emitting elements are arranged, a light guide plate on which light emitted from the light emitting elements is incident and which radiates the incident light toward a liquid crystal panel, and a housing casing which houses the printed circuit board and the light guide plate, wherein the housing casing is made of metal.

The light guide plate includes a light incident surface on which the light emitted from the light emitting elements is incident and a light radiation surface which intersects with the light incident surface and radiates the light toward the liquid crystal panel. The metal-made housing casing is provided with a side surface which faces the light incident surface in an opposed manner, and a printed circuit board on which the light emitting elements are mounted is arranged in the housing casing in a state that the printed circuit board is brought into contact with the side surface thus making use of the housing casing as a heat radiation plate.

A cutout portion is formed in the housing casing, and a resin member is fitted in the cutout portion. Due to the resin member which is fixed to the housing casing, a distance between the light guide plate and the housing casing is maintained at a fixed value.

According to the present invention, the liquid crystal display device is characterized in that, in the backlight which uses LEDs as the light emitting element by taking the heat radiation of the backlight into consideration, the backlight can efficiently house a heat-radiation plate having an increased area.

Further, by utilizing the metal-made heat-radiation plate as the housing casing and, at the same time, by maintaining the distance between the light guide plate and the metal-made housing casing at a fixed value with the use of the resin member, it is possible to prevent the light guide plate from being damaged attributed to the metal-made plate, and by maintaining a distance between the light emitting elements and the light guide plate at a fixed value, the liquid crystal display device can maintain the excellent display quality.

According to the present invention, the liquid crystal display device which uses the LEDs as the light emitting element can acquire the highly reliable LED light source. Further, the liquid crystal display device can efficiently house the heat-radiation plate in the backlight.

DETAIL DESCRIPTION OF THE EMBODIMENTS

A liquid crystal display device includes a liquid crystal panel and a backlight which radiates light to the liquid crystal panel, wherein the backlight includes a light guide plate, a printed circuit board which is formed along one side of the light guide plate, a plurality of LEDs which is mounted on the printed circuit board, and a metal-made housing casing which houses the light guide plate and the printed circuit board therein. Here, the light guide plate includes a light incident surface on which light emitted from the LEDs is incident, a light radiation surface from which the light is radiated toward the liquid crystal panel, and a bottom surface which faces the light radiation surface in an opposed manner.

In the metal-made housing casing, a first side surface is formed to face the light incident surface of the light guide plate in an opposed manner, and a printed circuit board is arranged on the first side surface by adhesion.

A second side surface is formed on a surface of the housing casing which intersects with the first side surface, and a fixing member which keeps a distance between the light guide plate and the housing casing at a fixed value is formed on the second side surface. The fixing member is made of a resin and is fitted in a cutout portion formed in the second side surface.

When the housing casing is made of metal, there arises a drawback that the light guide plate is damaged due to a contact between the light guide plate and the housing casing. However, by mounting the resin-made fixing member on the housing casing, it is possible to prevent the direct contact between the housing casing and the light guide plate.

Figure 1:
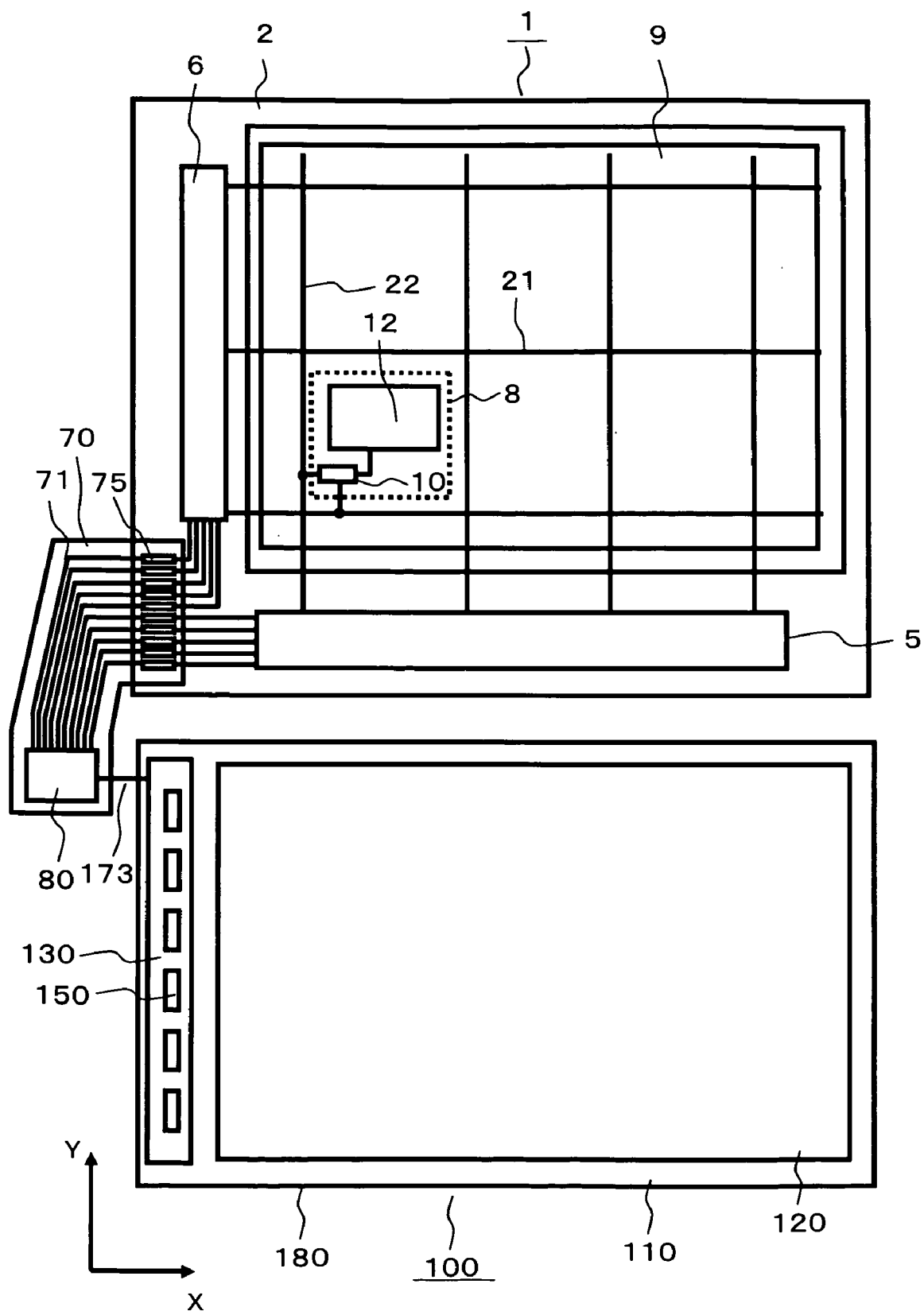
FIG. 1 is a block diagram showing the schematic constitution of a liquid crystal display device according to an embodiment of the present invention.

FIG. 1 is a plan view showing a liquid crystal display device 100 of the present invention. The liquid crystal display device 100 is constituted of a liquid crystal panel 1, a backlight 110 and a control circuit 80. Signals and power source voltages necessary for performing display of the liquid crystal panel 1 are supplied from the control circuit 80. The control circuit 80 is mounted on a flexible printed circuit board 70, and signals are transmitted to the liquid crystal panel 1 via lines 71 and terminals 75. Further, a required voltage is supplied to the backlight 110 via lines 173.

The backlight 110 is constituted of a light guide plate 120, a light source portion 130, a housing casing 180 and light emitting elements 150 provided to the light source portion 130. The backlight 110 is provided for radiating light to the liquid crystal panel 1. The liquid crystal panel 1 performs a display by controlling a transmission quantity or a reflection quantity of light radiated from the backlight 110. Here, the backlight 110 is mounted on a back surface side or a front surface side of the liquid crystal panel 1 in a stacked manner as viewed from a viewer. However, in FIG. 1, to facilitate the understanding of the constitution of the liquid crystal display device, the backlight 110 is shown in a state that the backlight 110 is arranged parallel to the liquid crystal panel 1. The backlight 110 is explained in detail later.

A pixel electrode 12 is formed in a pixel portion 8 of the liquid crystal panel 1. Here, the liquid crystal panel 1 includes a large number of pixel portions 8 in a matrix array. However, to avoid the drawing from becoming cumbersome, in FIG. 1, only one pixel portion 8 is illustrated. The pixel portions 8 which are arranged in a matrix array form a display region 9, and the respective pixel portions 8 play the role of pixels of a display image, and an image is displayed on the display region 9.

The liquid crystal panel 1 is provided with gate signal lines (also referred to as scanning lines) 21 which extend in the x direction and are arranged parallel to each other in the y direction in the drawing and drain signal lines (also referred to as video signal lines) 22 which extend in the y direction and are arranged parallel to each other in the x direction in the drawing. The pixel portions 8 are formed in regions which are surrounded by the gate signal lines 21 and the drain signal lines 22.

A switching element 10 is provided to the pixel portion 8. The control signal is supplied to the switching element 10 from the gate signal lines 21 so as to control an ON/OFF state of the switching element 10. When the switching element 10 is turned on, the video signal which is transmitted via the drain signal line 22 is supplied to the pixel electrode 12.

The drain signal lines 22 are connected to a drive circuit 5, and video signals are outputted to the drain signal lines 22 from the drive circuit 5. The gate signal lines 21 are connected to a drive circuit 6, and control signals are outputted to the gate signal lines 21 from the drive circuit 6. Here, the gate signal lines 21, the drain signal lines 22, the drive circuit 5 and the drive circuit 6 are formed on the same TFT substrate 2. Further, the drive circuit 5 and the drive circuit 6 may be formed using one semiconductor element respectively.

Figure 2A:
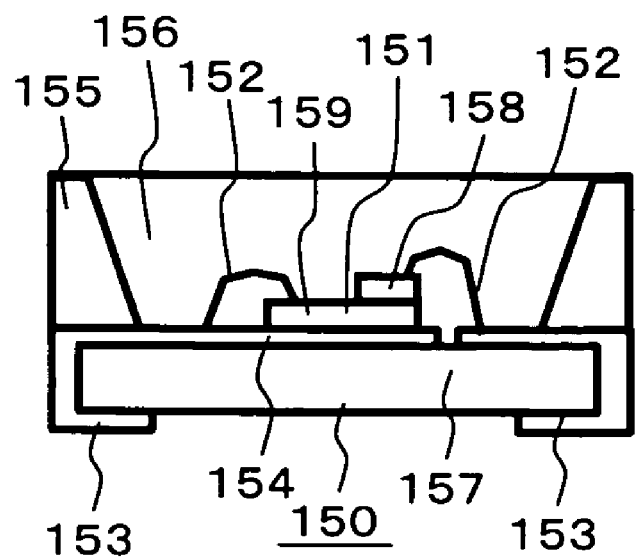
FIG. 2A and FIG. 2B are schematic views showing a light emitting diode of the liquid crystal display device according to the embodiment of the present invention.
Figure 2B:
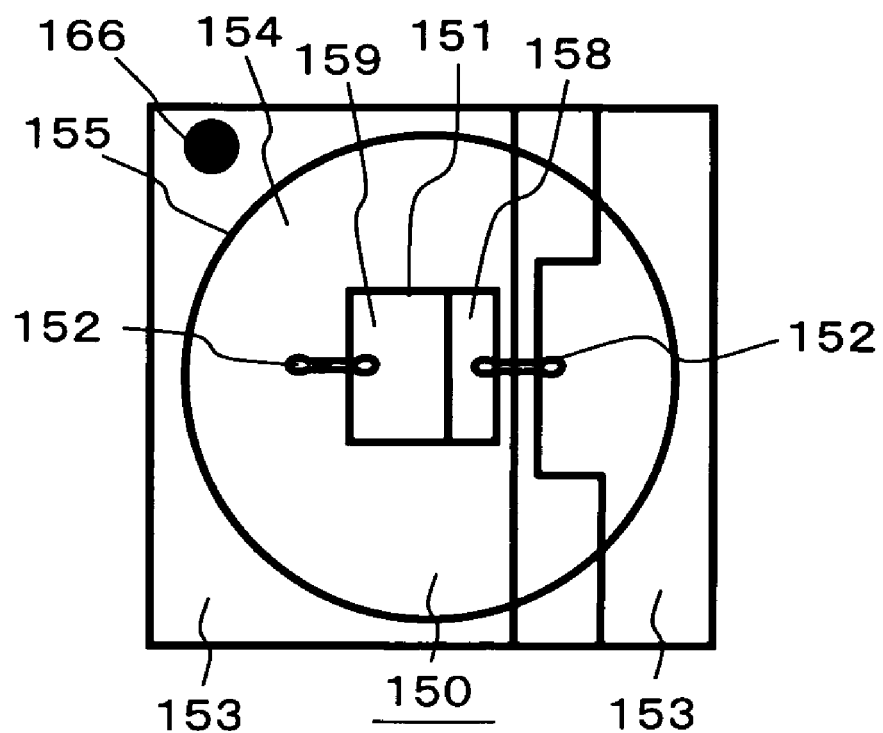

Next, FIG. 2A and FIG. 2B are schematic views showing an LED 150 which constitutes the light emitting element, wherein FIG. 2A is a schematic cross-sectional view of the LED 150, and FIG. 2B is a front view of the LED 150 as viewed from a light-emission side.

The LED 150 has the structure which mounts an LED chip 151 constituting a light emitting portion on a chip substrate 157. The LED chip 151 has a pn junction, and light having a specific wavelength is radiated when a voltage is applied to the pn junction. A p electrode (anode) 158 is formed on a p-type semiconductor layer which forms the pn junction, and an n electrode (cathode) 159 is formed on an n-type semiconductor layer which forms the pn junction.

Wires 152 are connected to the p electrode 158 and the n electrode 159 respectively. With these wires 152, chip terminals 153 which are provided for connecting the LED 150 and the outside are electrically connected with the p electrode 158 and the n electrode 159.

A fluorescent light emitting portion 156 may be formed on the light radiation surface side of the LED chip 151. The fluorescent light emitting portion 156 has a function of converting a wavelength of light which is emitted from the LED chip 151. Here, numeral 155 indicates a cone-shaped reflection surface, and the cone-shaped reflection surface reflects light advancing in the lateral direction to the light-radiation-surface side. Numeral 166 indicates a mark indicative of a position of a cathode (or an anode).

While the chip terminals 153 are connected with external lines or the like on a back surface of the chip substrate 157, the chip terminals 153 extend to the light-radiation-surface side from the back surface of the chip substrate 157 by way of side surfaces of the chip substrate 157 and form a chip mounting portion 154. By forming the chip terminals 153 and the chip mounting portion 154 using metal which exhibits high optical reflectance, it is possible to make use of the chip mounting portion 154 as a light reflection surface. Further, by forming the chip terminals 153 and the chip mounting portion 154 using metal (also an electricity conductive material) which exhibits high heat conductivity, it is possible to radiate heat generated by the LED chip 151 to a back surface side of the chip substrate 157.

Figure 3A:
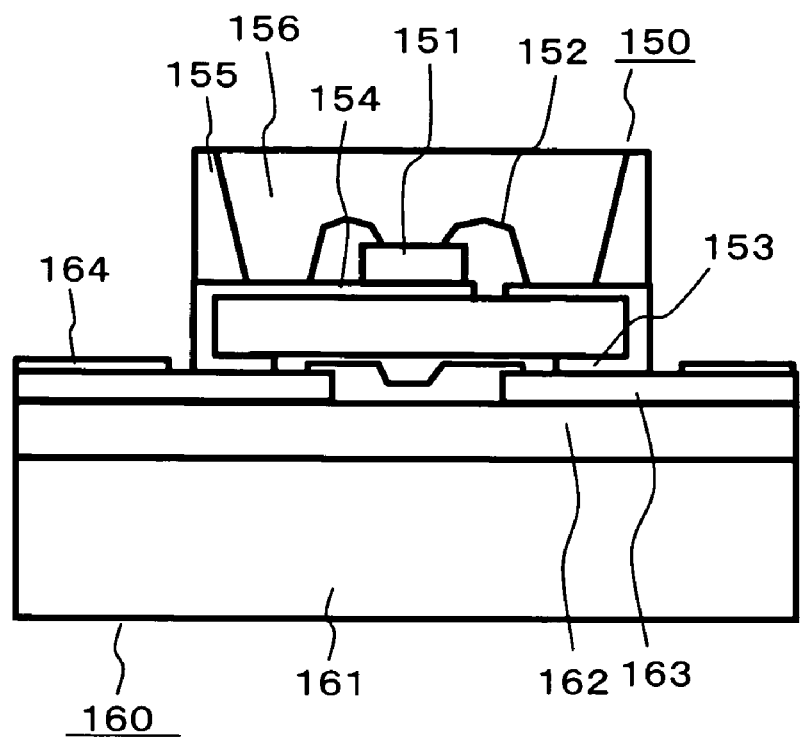
FIG. 3A and FIG. 3B are schematic views showing a state in which the light emitting diode of the liquid crystal display device according to the embodiment of the present invention is mounted on a metal-made substrate.
Figure 3B:
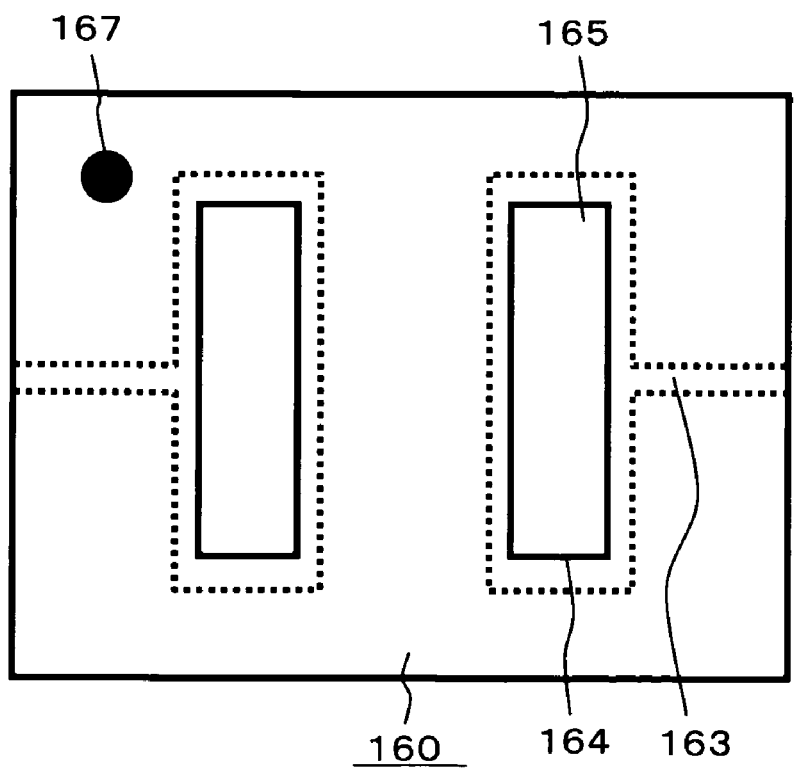

Next, the printed circuit board on which the LED chip 151 being mounted is explained in conjunction with FIG. 3A and FIG. 3B. FIG. 3A is a schematic cross-sectional view showing a state in which the LED chip 151 is mounted on a metal substrate 161. FIG. 3B is a schematic front view showing a portion of the metal substrate 161 on which the LED chip 151 is mounted.

With respect to the mounting substrate 160, an FPC 162 is arranged on the metal substrate 161, and lines 163 are formed of a conductive layer made of a copper foil or the like which is arranged on the FPC 162. An insulation layer 164 is formed on the lines 163, opening portions are formed in the insulation layer 164 on the conductive layer, and connecting pads 165 are formed in the opening portions.

A base material of the mounting substrate 160 is made of metal and hence, it is possible to effectively radiate heat which is transmitted to a back-surface side of the chip substrate 157. To increase the heat radiation efficiency, it is desirable to decrease a thickness of the insulation layer 164 provided that a problem such as short-circuiting or leaking of an electric current can be prevented. In this embodiment, the insulation layer 164 is formed of an insulation layer having a thickness of 0.12 mm and heat conductivity of 6.5 W/m·K.

Chip terminals 153 of the LED chip 151 are electrically connected to the connecting pads 165 which are formed on end portions of the lines. As described above, the insulation layer is applied to the front surface of the mounting substrate by coating thus preventing the lines from being short-circuited with other constitutional components on a front-surface side of the mounting substrate 160 and holding insulation between the pads 165. To the pads 165, a solder paste or the like is applied by printing, and the LED chip 151 is mounted on the mounting substrate 160 using a reflow process or the like.

The LED chip 151 is mounted on the mounting substrate 160 using the solder-reflow process and hence, the insulation layer 164 is formed of a member which exhibits low affinity with the solder. However, since the insulation layer 164 is formed on the front surface of the mounting substrate 160, the insulation layer 164 is preferably formed of a member having achromatic color. Particularly, in view of the light utilization efficiency, the insulation layer 164 is preferably made of a white or whitish material so that the insulation layer 164 can reflect a large quantity of light. As a material which exhibits high reflectivity, titanium oxide or the like is preferably used. Here, numeral 167 indicates a mark for indicating a position of a cathode (or anode). For enhancing the visibility of the liquid crystal display device, color different from the color of the insulation layer 164 is used for forming the mark 167.

Figure 4A:
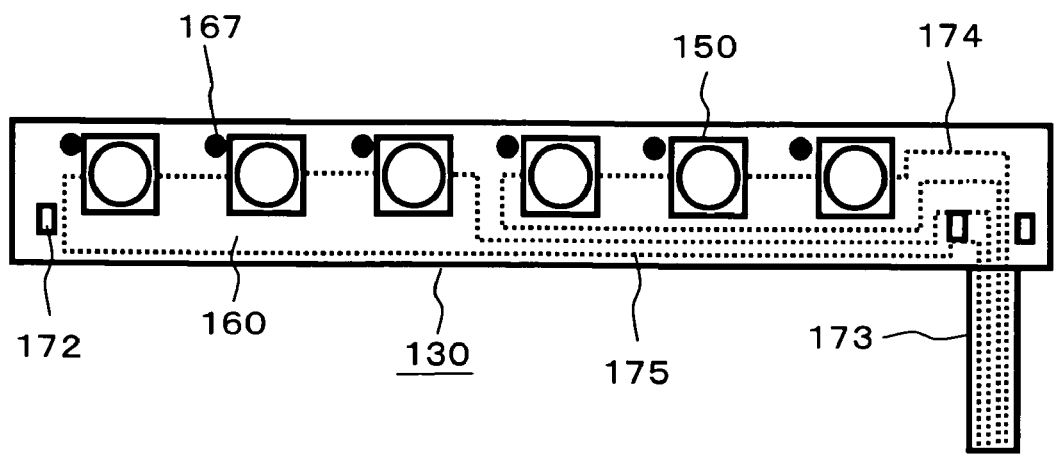
FIG. 4A to FIG. 4C are schematic views showing a plate-like light source portion of the liquid crystal display device according to the embodiment of the present invention.
Figure 4B:
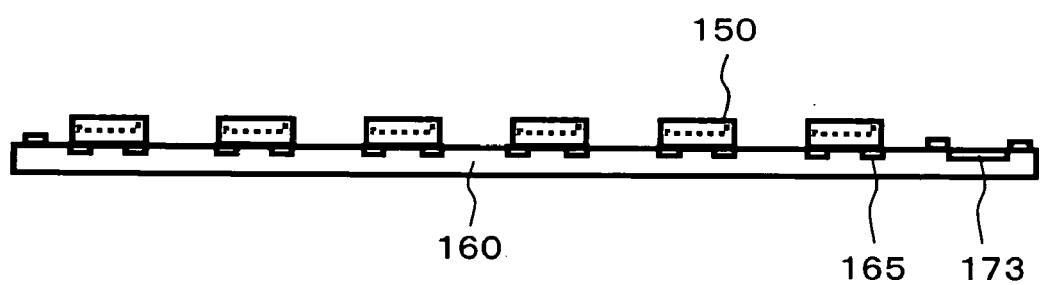
Figure 4C:
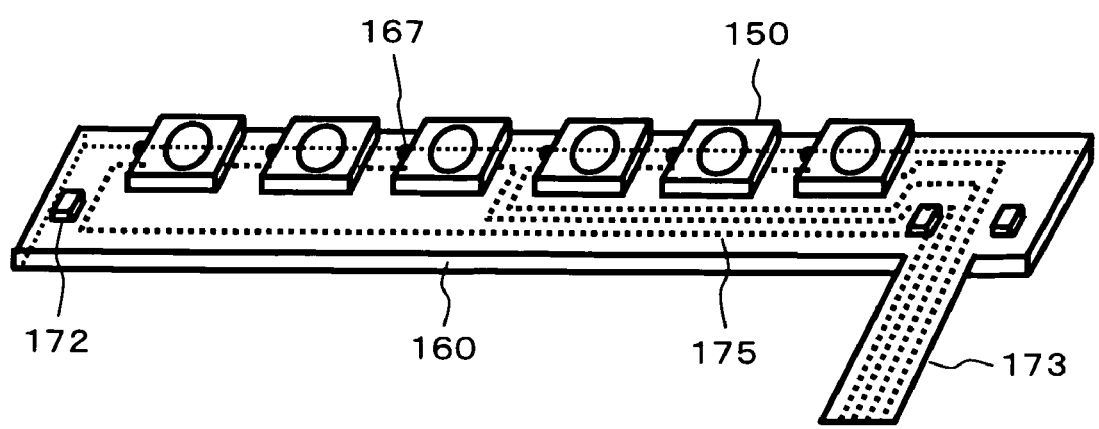

Next, a state in which the LEDs 150 are linearly mounted on the mounting substrate 160 thus forming a plate-shaped light source 130 is explained in conjunction with FIG. 4A, FIG. 4B and FIG. 4C, wherein FIG. 4A is a schematic front view of the plate-shaped light source 130, FIG. 4B is a schematic cross-sectional view of the plate-shaped light source 130, and FIG. 4C is a schematic perspective view of the plate-shaped light source 130.

In FIG. 4, six LEDs 150 are arranged parallel to each other on the mounting substrate 160 so as to form the linear light source. The LED 150 generates a fixed voltage difference in the pn junction due to the characteristic of a diode. The voltage difference in the pn junction differs depending on a manufacturing process and hence, the LED 150 is adjusted to apply an optimum voltage to the pn junction. However, when n pieces of LEDs 150 are connected with each other in parallel, n pieces of adjustment circuits become necessary thus giving rise to a drawback that a manufacturing cost is pushed up due to the adjustment of the voltages.

In FIG. 4A to FIG. 4C, the LEDs 150 are connected in series with each other for every three LEDs 150, and the voltage is adjusted for every three LEDs 150. When a vehicle-mounting voltage 12V is used as a power source voltage and a potential difference generated between the respective LEDs 150 is approximately 4V, it is possible to efficiently apply the voltage to the LEDs 150 by connecting the LEDs 150 in series for every three LEDs 150. That is, assuming the relationship among the power source voltage V, the potential difference Vd generated in the average LED 150, and the number n of the LEDs 150 as V>=n×Vd, it is possible to efficiently apply the voltage to the LEDs 150. Here, when the potential difference generated in the respective LEDs 150 is approximately 3V and the power source voltage is 12V, it is possible to efficiently apply the voltage to the LEDs 150 by connecting the LEDs 150 in series for every four LEDs 150. Further, when the voltage adjustment is performed by inserting a resistance 172 between the last LED 150 out of n pieces of LEDs 150 which are connected with each other in series and a ground potential, two lines, that is, a voltage-supply-use line 174 and a return-use line 175 become necessary for every serial connection. In this embodiment, four lines become necessary, and the respective lines are connected to an external connection line 173.

As shown in FIG. 4C, the lines 174, 175 are formed on the mounting substrate 160. When the number of the LED 150 is increased, an area on which the lines 174, 175 are formed is also increased. In the drawing, below the LEDs 150, the lines 174, 175 whose number corresponds to the number of LED 150 are arranged. Further, electric elements such as resistances and capacitances necessary for the circuit are also arranged on the mounting substrate 160.

Figure 5:
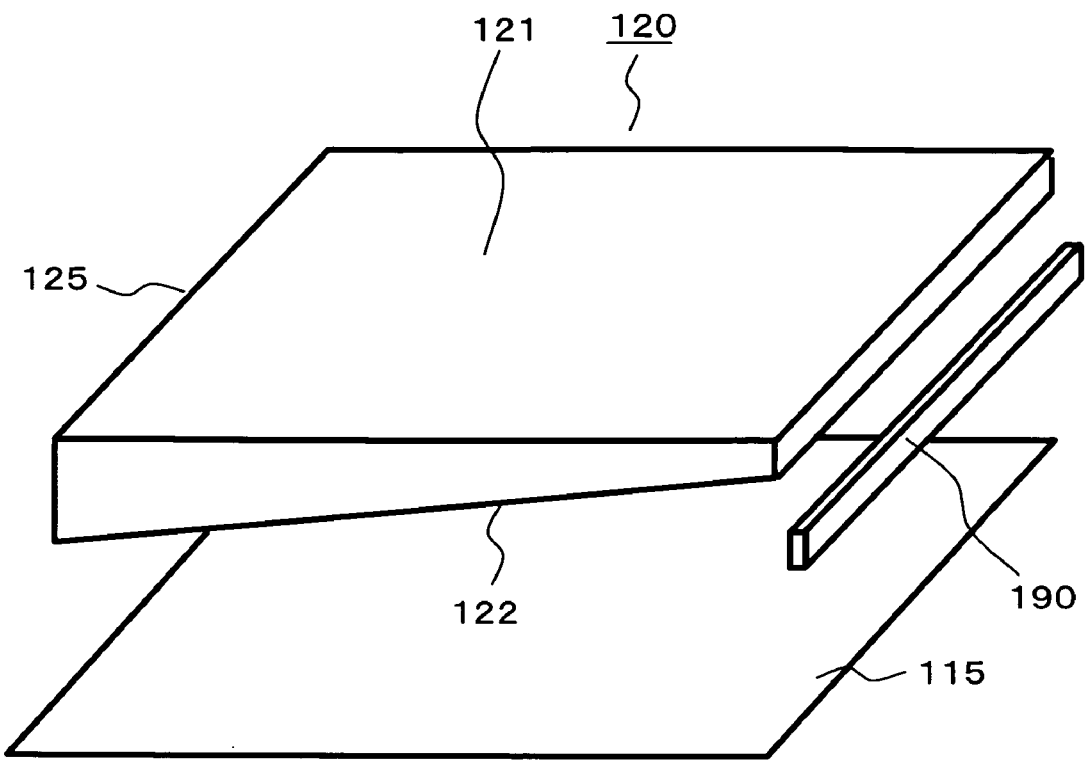
FIG. 5 is a schematic view showing the structure of a backlight of the liquid crystal display device according to the embodiment of the present invention.
Figure 5:
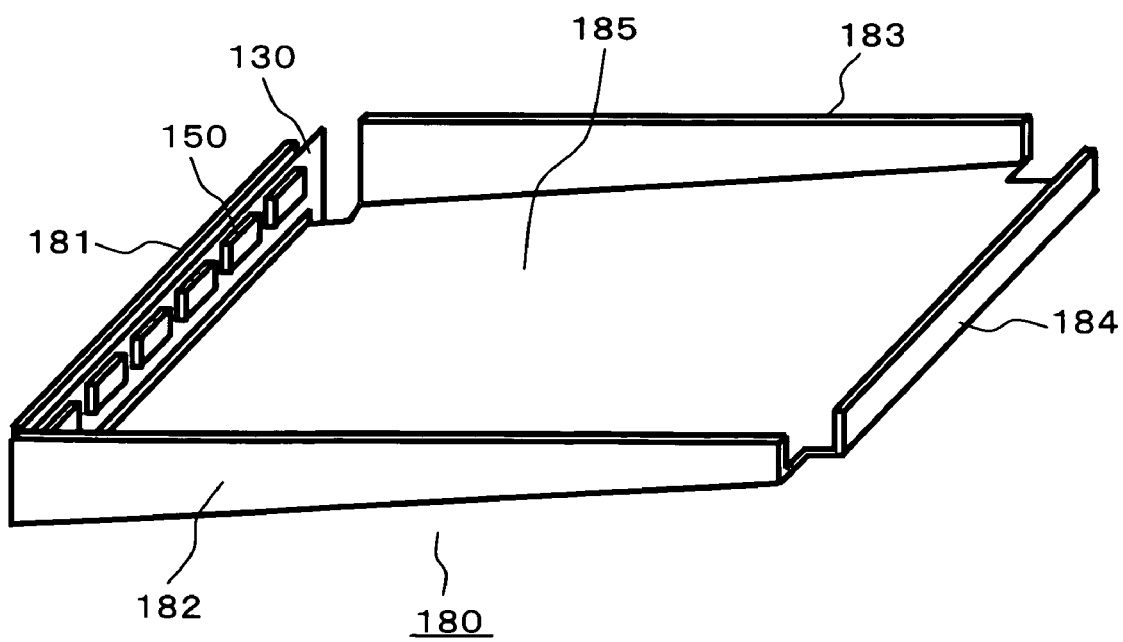

Next, the housing casing 180 which houses the light guide plate 120 and the plate-shaped light-source portion 130 therein is explained in conjunction with FIG. 5. The housing casing 180 is made of metal and is formed into a box shape which allows the housing casing 180 to house the light guide plate 120 therein.

The light guide plate 120 includes a light incident surface 125, a light radiation surface 121, and a lower surface 122. Light emitted from the plate-shaped light-source portion 130 is incident on the light incident surface 125 and is radiated from the light radiation surface 121. The lower surface 122 is arranged in an inclined manner with respect to the light radiation surface 121 so that the light guide plate 120 is formed in a wedge shape. Here, the light guide plate 120 may be formed in a shape different from the wedge shape, that is, a distance between the light radiation surface 121 and the lower surface 122 may be set to a fixed value.

The housing casing 180 includes a bottom surface 185. The housing casing 180 also includes a first side surface 181, a second side surface 182, a third side surface 183 and a fourth side surface 184 which surround four sides of the bottom surface 185. The first side surface 181 is formed to face the light incident surface 125 in an opposed manner, and the plate-shaped light-source portion 130 is adhered to the first side surface 181.

The housing casing 180 is made of metal. Accordingly, by bringing the plate-shaped light-source portion 130 into contact with the housing casing 180, the housing casing 180 functions as a heat radiation plate. However, the positional relationship between the plate-shaped light-source portion 130 and the light incident surface 125 influences a quantity of light which is incident on the light guide plate 120 and hence, the first side surface 182 is arranged to face the light incident surface 125 in an opposed manner as well as in a state that the position of the first side surface 181 is not easily changed.

A cushion material 190 is provided between the housing casing 180 and the light guide plate 120 so as to prevent the light guide plate 120 from being moved or broken due to vibrations or the like. Further, a reflection sheet 115 is arranged on the bottom surface 185 of the housing casing 180, and the reflection sheet 115 reflects light leaked from the light guide plate 120 toward the light radiation surface 121.

As shown in FIG. 5, by forming the housing casing 180 in a box shape and by providing the cushion material 190 in the housing casing 180, the light guide plate 120 can be housed in the housing casing 180. However, in this case, there arises a problem that the light guide plate 120 is easily moved in the inside of the housing casing 180.

However, when the light guide plate 120 is fixed by the housing casing 180 to cope with such a problem, the LEDs 150 and the light guide plate 120 are brought into contact with each other thus damaging the light guide plate 120 or breaking the LED 150.

Here, by bringing the housing casing 180 into contact with the plate-shaped light-source portion 130, the housing casing 180 acquires a function of the heat radiation plate. However, the FPC 162 of the plate-shaped light-source portion 130 may be directly adhered to the first side surface 181. That is, by using the first side surface 181 as a portion of the plate-shaped light-source portion 130, the light source 150 and the housing casing 180 can be integrally formed with each other.

Figure 6:
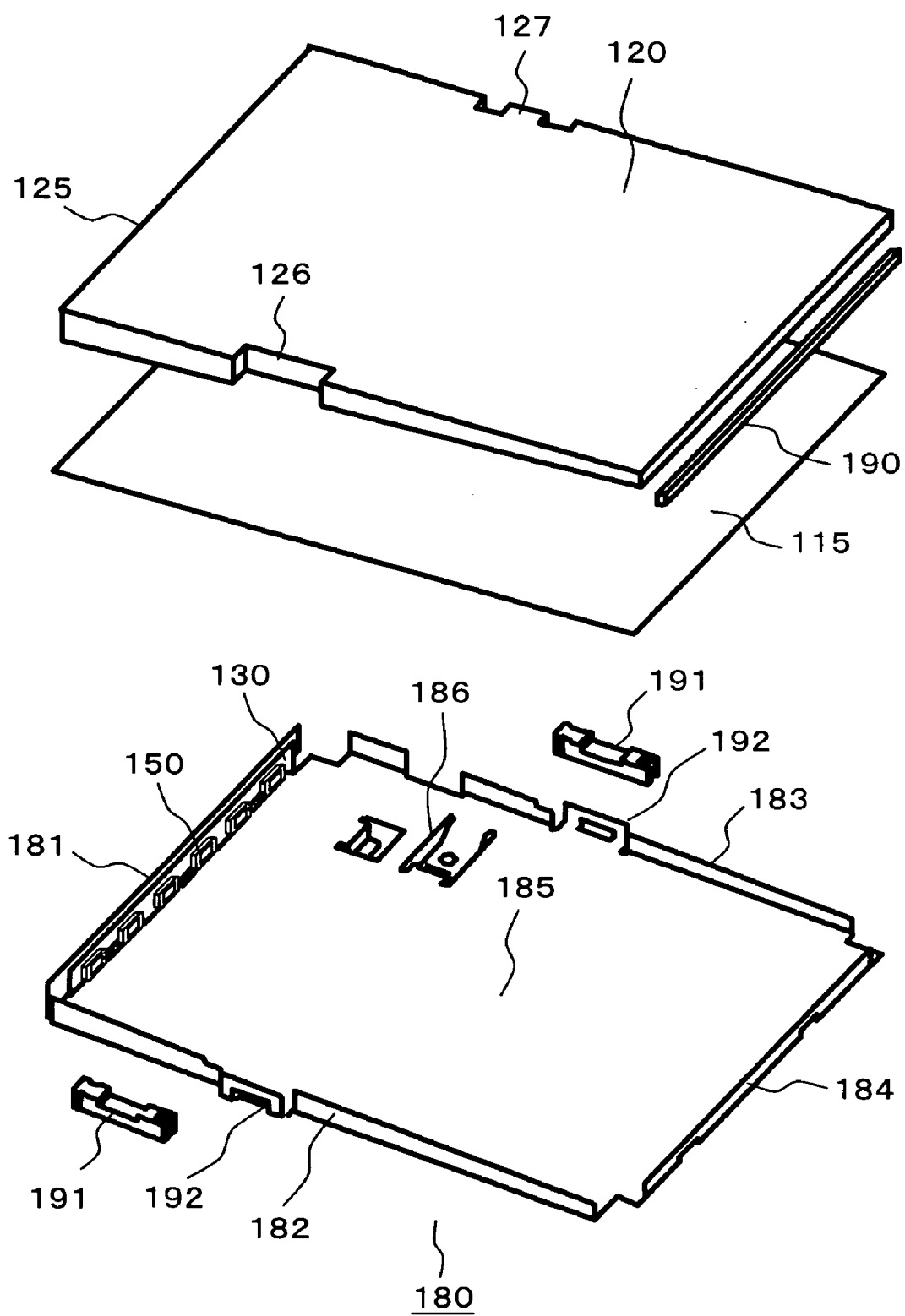
FIG. 6 is a schematic perspective view showing the structure of the backlight of the liquid crystal display device according to the embodiment of the present invention.

Next, FIG. 6 shows the constitution which mounts resin-made fixing members on the housing casing 180 so as to overcome the drawback that the light guide plate 120 is damaged due to the above-mentioned contact. The plate-shaped light-source portion 130 is adhered to the first side surface 181 of the housing casing 180, and mounting portions 192 are formed on the second side surface 182 and the third side surface respectively, and fixing resin members 191 can be mounted on the mounting portions 192.

FIG. 6 shows, for facilitating the understanding of the structure of the backlight, a state in which the fixing resin member 191 is removed from the mounting portion 192. The light guide plate 120 is fixed and held by mounting the fixing resin member 191 on the housing casing 180. On the light guide plate 120, a fixing recessed portion 126 or a fixing concave/convex portion 127 is formed. The fixing resin member 191 is engaged with the fixing recessed portion 126 or the fixing concave/convex portion 127 by fitting engagement.

There is no difference in hardness between the light guide plate 120 and the fixing resin member 191 and hence, even when a force is applied to the light guide plate 120 from the fixing resin member 191, there is no possibility that the light guide plate 120 is easily damaged by the fixing resin member 191.

Numeral 186 indicates a printed-control-circuit-board holding portion which can hold and fix a printed control circuit board of the liquid crystal display device to a back side of the bottom surface 185.

Here, when the distance between the light incident surface of the light guide plate 120 and the LED 150 is changed, there arises a drawback that a quantity of incident light (a light incident ratio) is changed. Accordingly, it is necessary to prevent the distance between the light incident surface 125 and the LED 150 from being easily changed due to the thermal expansion, the vibrations or the like. The fixing resin members are provided for preventing the light guide plate 120 from being moved toward the LED 150.

That is, by adhering a plate-shaped light source portion to the first side surface 181, the housing casing 180 and the plate-shaped light source portion 130 can be integrally formed with each other whereby the heat radiation efficiency can be enhanced. However, since the housing casing 180 and the plate-shaped light source portion 130 are integrally formed with each other, when the position of the light guide plate 120 relative to the housing casing 180 is changed, there arises a drawback that optical quality is lowered.

In FIG. 6, the fixing resin member 191 is mounted on the second side surface 182 or the third side surface 183 which is formed so as to intersect the first side surface 182. Accordingly, it is possible to restrict the movement of the light guide plate 120 toward the first side surface 181 using the fixing resin member 191.

Figure 7:
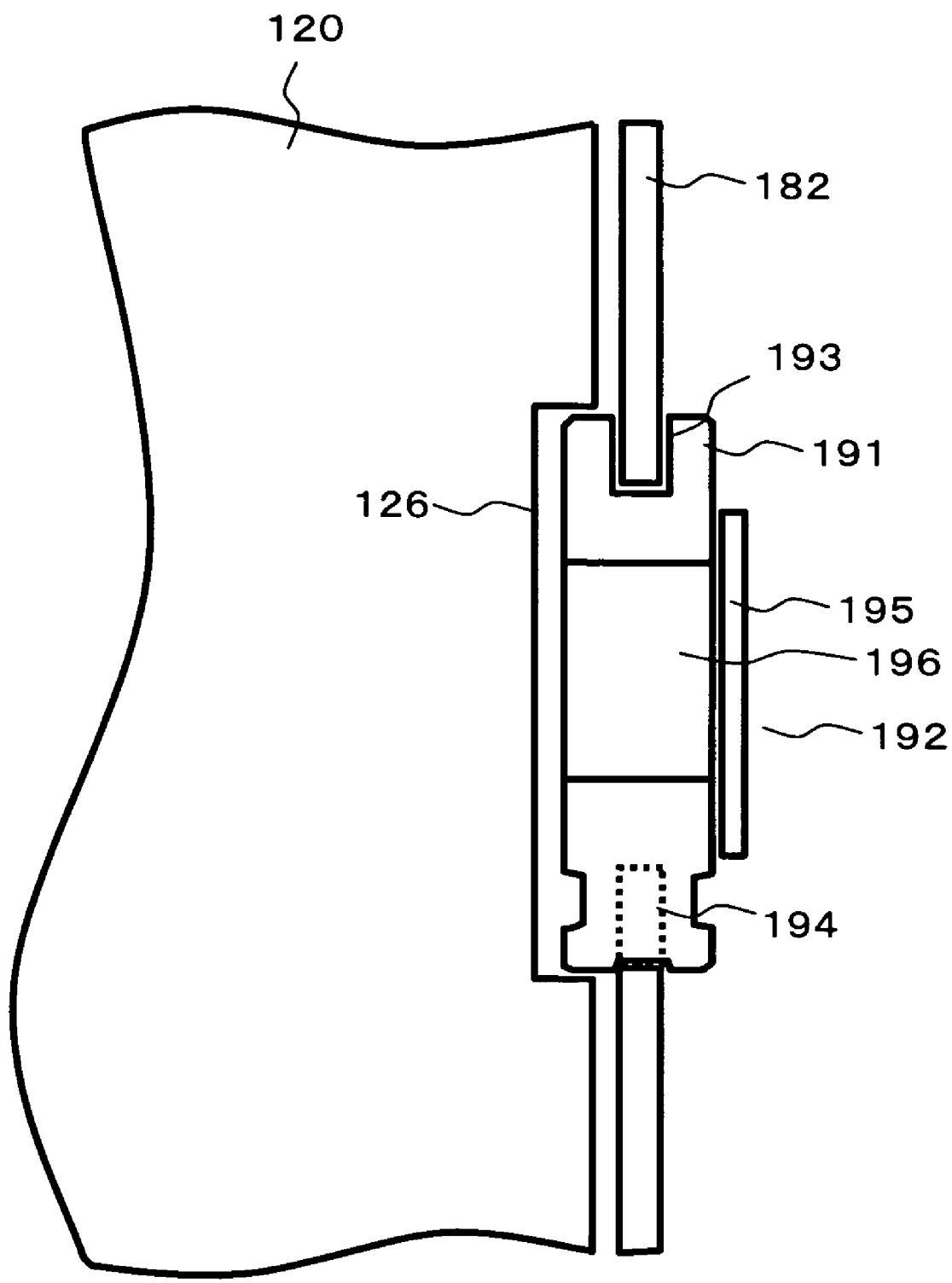
FIG. 7 is a schematic view showing the mounting structure of a light guide plate of the liquid crystal display device according to the embodiment of the present invention.

Next, FIG. 7 shows a state in which the fixing resin member is mounted on the second side surface 182. A groove 193 is formed in the fixing resin member 191, and a portion of the second side surface 182 is fitted in the groove 193. Further, a groove 194 is formed also in another end portion of the fixing resin member 191, and a portion of the second side surface 182 is fitted in the groove 194. The groove 194 is stopped at a middle portion of another end portion thus having a shape different from a shape of the groove 193. The shapes of the groove 193 and the groove 194 are made different from each other for preventing erroneous mounting (mounting direction) of the fixing resin member 191.

To allow fitting of the fixing resin member 191 fixed to the mounting portion 192 in the light guide plate 120, a fixing recessed portion 126 is formed in the light guide plate 120. By fitting the fixing resin member 191 in the fixing recessed portion 126, the light guide plate 120 is fixed to the housing casing 180.

A holding plate 195 is arranged outside the mounting portion 192. The holding plate 195 restricts the movement of the fixing resin member 191 toward the outside and, at the same time, plays a role of protecting the fixing resin member 191.

An optical sheet holding groove 196 is formed in an upper surface of the fixing resin member 191 thus allowing the fixing resin member 191 to hold an optical sheet mounted on the light guide plate 120.

Figure 8:
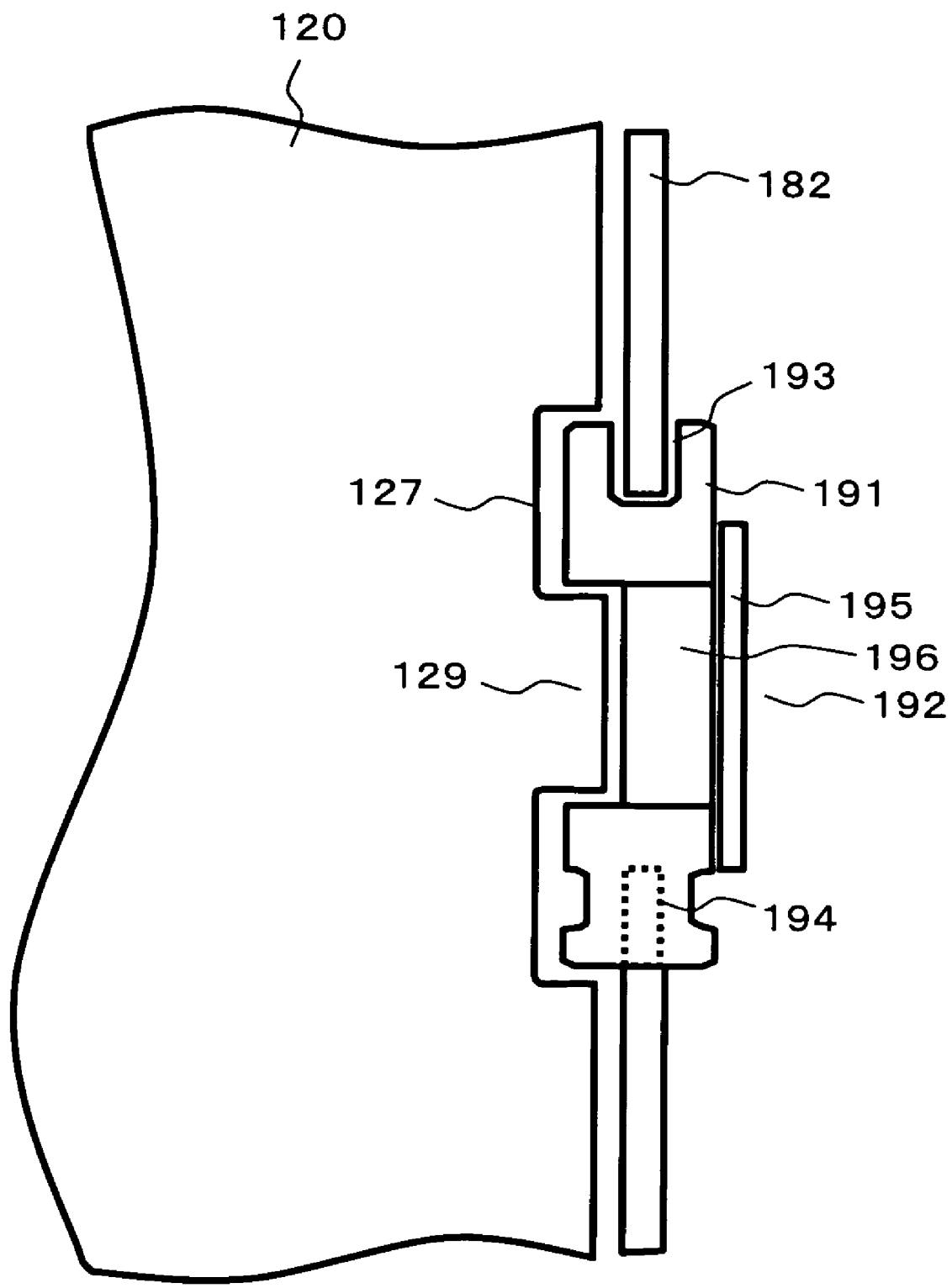
FIG. 8 is a schematic view showing the mounting structure of the light guide plate of the liquid crystal display device according to the embodiment of the present invention.

Next, FIG. 8 shows a state in which a fixing concave/convex portion 127 is formed on the light guide plate 120 in conformity with the fixing resin member 191. In the same manner as the fixing resin member 191 shown in FIG. 7, the fixing resin member is mounted on the second side surface 182 of the housing casing 180 with a provision of the groove 193, the groove 194 and the holding plate 195.

The fixing concave/convex portion 127 is formed in the light guide plate 120 such that the fixing resin member 191 is fitted in the fixing concave/convex portion 127. Due to the fitting engagement of fixing concave and convex portions of the fixing concave/convex portion 127 with the fixing resin member 191, the light guide plate 120 is fixed to the housing casing 180.

In the same manner as the optical sheet holding groove 196 shown in FIG. 7, an optical sheet holding groove 196 is formed in the fixing resin member 191. An optical sheet mounted on the light guide plate 120 also has a projecting portion having the same width as a projection 129 of the light guide plate 120, and the projecting portion of the optical sheet can be held by the optical sheet holding groove 196. Further, chamfering may be applied to corner portions of the fixing resin member 191 for preventing undesired reflection of light.

Further, by adopting black as color of the fixing resin member 191, it is also possible to prevent the reflection of undesired light. Here, for adjusting a quantity of light radiated from the vicinity of the fixing resin member 191, the fixing resin member 191 may have achromatic color or specific color.

Figure 9A:
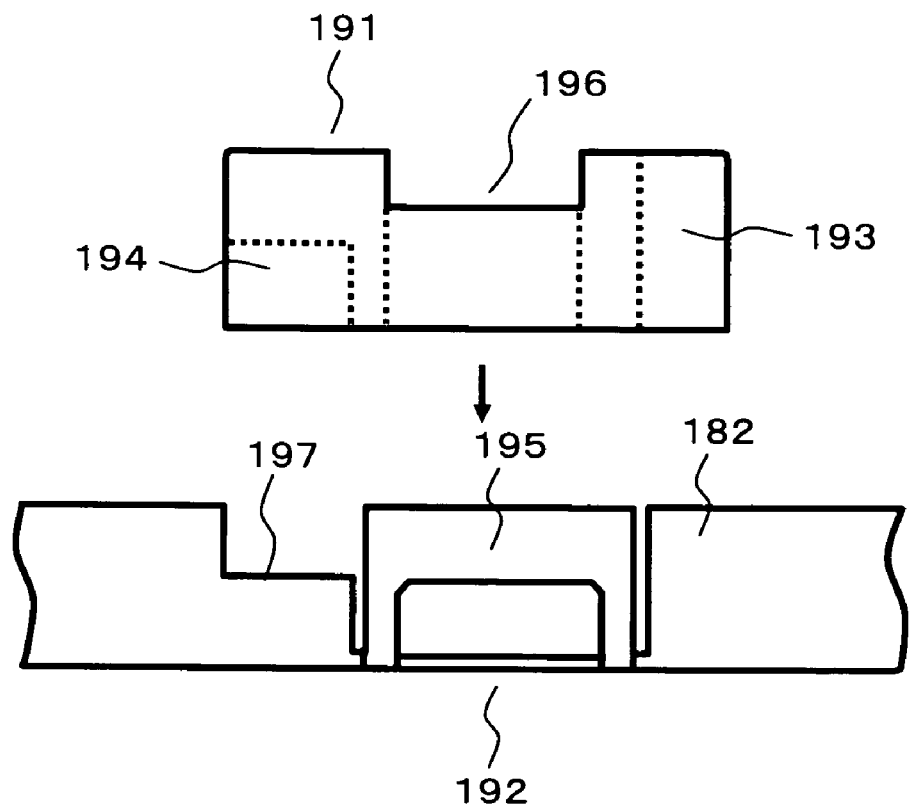
FIG. 9A and FIG. 9B are schematic views showing the mounting structure of the light guide plate of the liquid crystal display device according to the embodiment of the present invention.
Figure 9B:
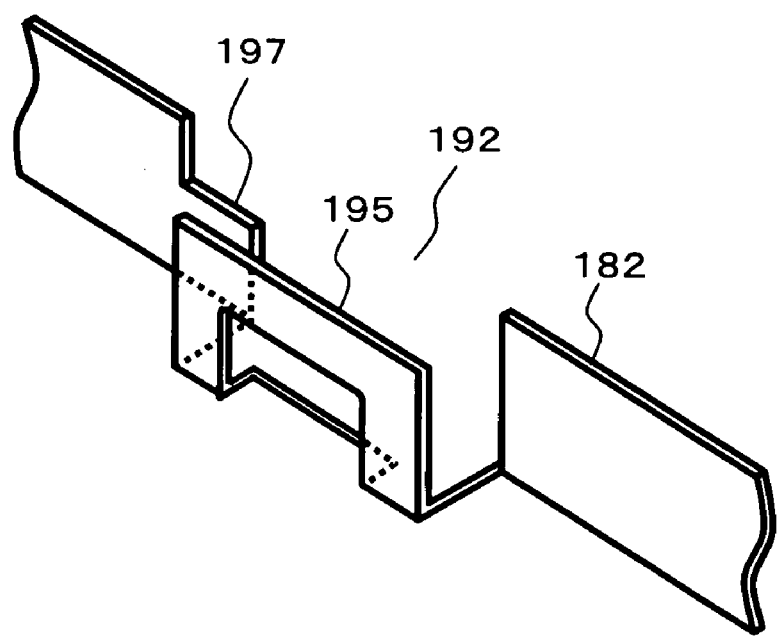

Next, the mounting portion 192 is explained in conjunction with FIG. 9A and FIG. 9B. The mounting portion 192 is formed on a portion of the second side surface 182 or the third side surface 183, and is integrally formed with the housing casing 180 made of metal. FIG. 9A shows the relationship between the mounting portion 192 and the fixing resin member 191. By pushing the fixing resin member 191 into the mounting portion 192 in the direction indicated by an arrow, the fixing resin member 191 is mounted on the mounting portion 192.

As described previously, the groove 193 and the groove 194 are formed in the fixing resin member 191. By fitting portions of the side surface in the grooves 193, 194, the fixing resin member 191 is fixed. Here, the groove 194 does not penetrate the fixing resin member 191 from below to above and is closed at a middle portion of the fixing resin member 191. Accordingly, a cutout portion 197 is formed in the portion of the side surface corresponding to the groove 194.

FIG. 9B is a perspective view for explaining the position of the holding plate 195. The holding plate 195 project southward from the second side surface 182 (also projecting from the third side surface 183 in the same manner) for holding the fixing resin member 191 from the outside.

Figure 10:
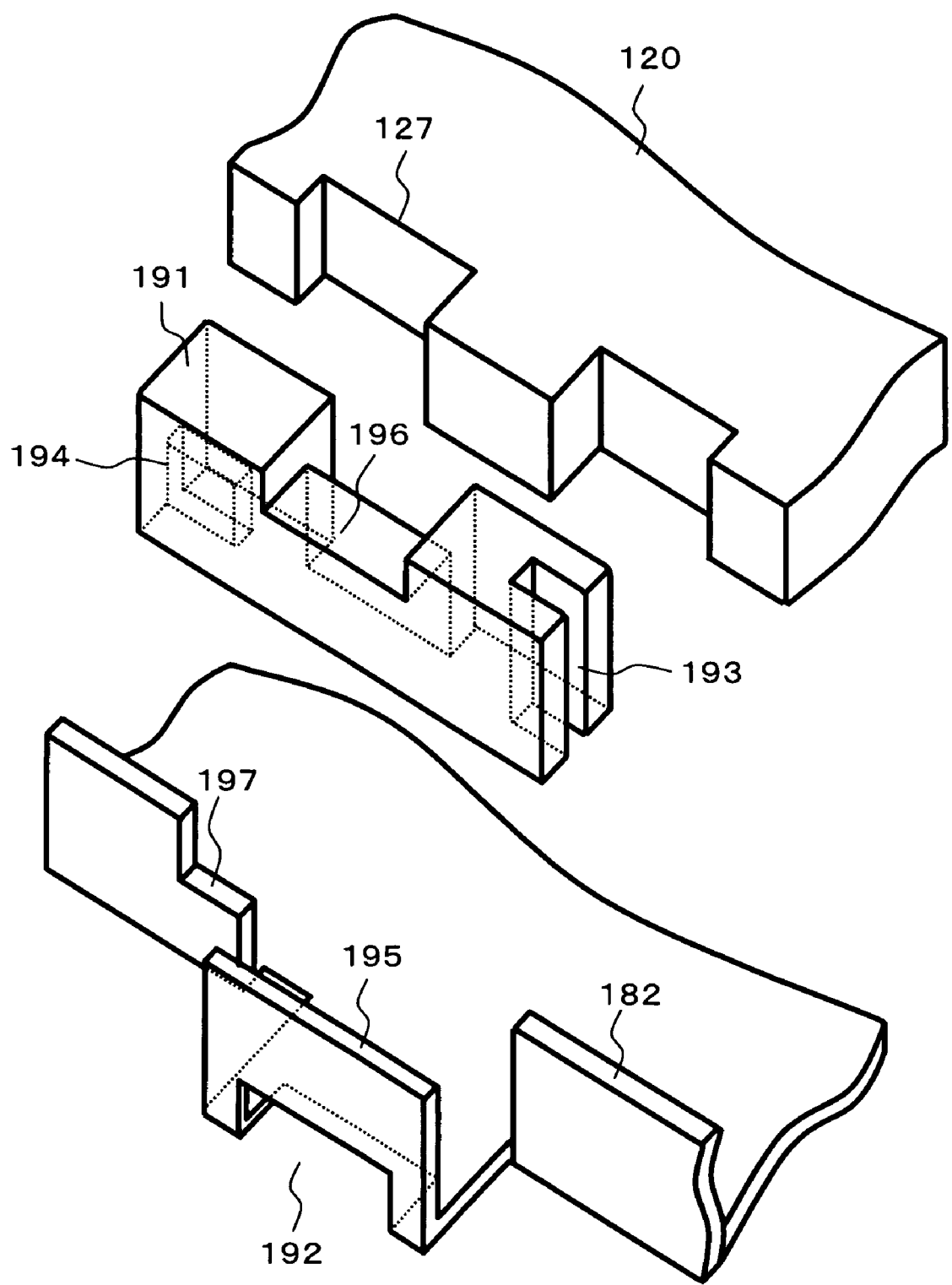
FIG. 10 is a schematic view showing the mounting structure of the light guide plate of the liquid crystal display device according to the embodiment of the present invention.

Next, FIG. 10 is a perspective view showing the relationship among the light guide plate 120, the fixing resin member 191 and the mounting portion 192.

Due to the fitting engagement between the fixing concave/convex portion 127 of the light guide plate 120 with the fixing resin member 191, the fixing resin member 191 is fixed to the mounting portion 192 and hence, the light guide plate 120 is fixed to the housing casing 180.

Figure 11:
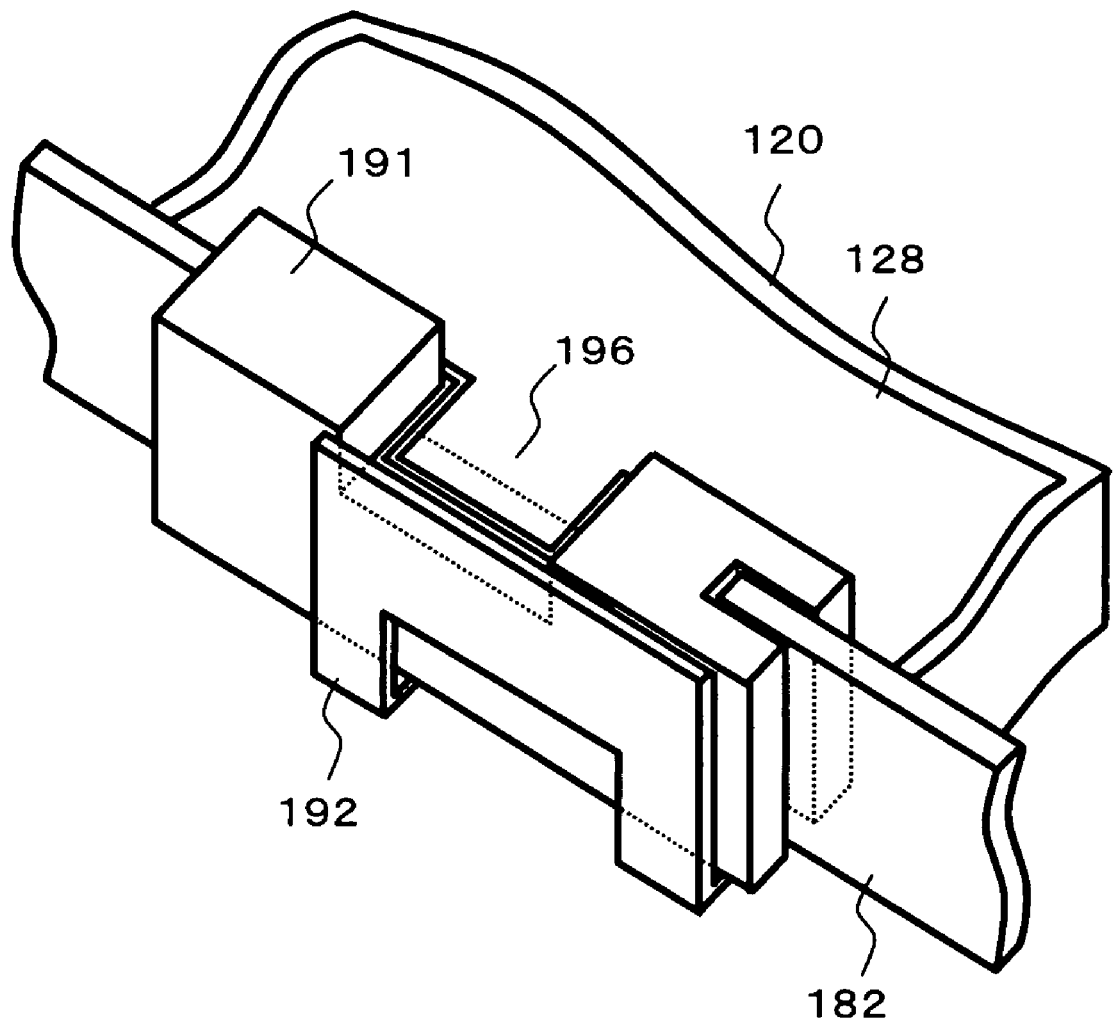
FIG. 11 is a schematic view showing the mounting structure of the light guide plate of the liquid crystal display device according to the embodiment of the present invention.

Next, FIG. 11 is a perspective view showing a state in which the light guide plate 120, the fixing resin member 191 and the mounting portion 192 are combined with each other. The optical sheet 128 is mounted on the light guide plate 120, and the projecting portion of the optical sheet 128 is arranged in the optical sheet holding groove 196 formed in the fixing resin member 191.

The light guide plate 120 is fixed by the fixing resin member 191 and hence, the light guide plate 120 is not brought into contact with the housing casing 180 whereby it is possible to prevent the light guide plate 120 from being damaged by the metal-made housing casing.

What is claimed is:

1. A liquid crystal display device comprising:
   a display panel;
   a backlight which radiates light to the display panel;
   a plurality of light emitting elements mounted on the backlight;
   a printed circuit board on which the light emitting elements are arranged;
   a light guide plate on which light emitted from the light emitting elements is incident;
   a housing casing which houses the light guide plate therein, the housing casing being made of metal and having a bottom surface and a first side surface and a second side surface which are folded to intersect the bottom surface, wherein the printed circuit board is arranged on the first side surface, and a resin member for fixing the light guide plate is formed on a mounting portion of the second side surface at a position where the second side surface intersects with a first side surface of the light guide plate.

2. A liquid crystal display device according to claim 1, wherein the light emitting element is an LED.

3. A liquid crystal display device according to claim 1, wherein a cutout portion is formed in the second side surface, and the resin member is fitted in the cutout portion.

4. A liquid crystal display device according to claim 1, wherein the printed circuit board is constituted by mounting a flexible printed circuit board on a metal plate.

5. A liquid crystal display panel comprising:
   a liquid crystal panel;
   a planar light source device which radiates light to the liquid crystal panel;
   light emitting diodes which are arranged linearly in the inside of the planar light source device;
   a printed circuit board which electrically connects the light emitting diodes;
   a light guide plate which has an incident surface on which light emitted from the light emitting diodes is incident; and
   a metal-made housing portion which houses the light guide plate therein, wherein
   the metal-made housing portion includes a side surface which faces the incident surface in an opposed manner,
   the printed circuit board is arranged on the side surface which faces the incident surface, and
   a resin member for fixing the light guide plate to keep a distance between the light guide plate and the printed circuit board is mounted on a mounting portion of the metal-made housing portion.

6. A liquid crystal display device according to claim 5, wherein an optical sheet is stacked on the light guide plate, and the resin member holds the optical sheet.

7. A liquid crystal display device according to claim 5, wherein the resin member is fitted in the metal-made housing portion.

8. A liquid crystal display device according to claim 5, wherein the printed circuit board is constituted by mounting a flexible printed circuit board on a metal plate.

* * * * *